US007966934B2

(12) United States Patent
Teng

(10) Patent No.: US 7,966,934 B2
(45) **Date of Patent: *Jun. 28, 2011**

(54) PROCESS FOR ON-PRESS DEVELOPING OVERCOAT-FREE LITHOGRAPHIC PRINTING PLATE

(76) Inventor: Gary Ganghui Teng, Northborough, MA (US)

( * ) Notice: Subject to any disclaimer, the term of this patent is extended or adjusted under 35 U.S.C. 154(b) by 2 days.

This patent is subject to a terminal disclaimer.

(21) Appl. No.: 12/244,759

(22) Filed: Oct. 2, 2008

(65) Prior Publication Data

US 2009/0025591 A1 Jan. 29, 2009

Related U.S. Application Data

(63) Continuation-in-part of application No. 12/236,485, filed on Sep. 23, 2003, and a continuation-in-part of application No. 11/604,603, filed on Nov. 27, 2006, now Pat. No. 7,655,382, and a continuation-in-part of application No. 11/645,376, filed on Dec. 26, 2006, and a continuation-in-part of application No. 11/787,878, filed on Apr. 17, 2007, now Pat. No. 7,752,966, which is a continuation-in-part of application No. 11/266,817, filed on Nov. 4, 2005, now Pat. No. 7,213,516.

(51) Int. Cl.
*G03F 7/038* (2006.01)

(52) U.S. Cl. .................. 101/451; 101/450.1; 430/270.1; 430/273.1

(58) Field of Classification Search .................. 101/451, 101/450.1; 430/270.1, 273.1
See application file for complete search history.

(56) References Cited

U.S. PATENT DOCUMENTS

| | | | | |
|---|---|---|---|---|
| 5,607,816 | A | 3/1997 | Fitzgerald et al. | 430/271.1 |
| 5,677,106 | A | 10/1997 | Burbery et al. | 430/253 |
| 6,030,750 | A | 2/2000 | Vermeersch et al. | 430/270.1 |
| 6,410,208 | B1 * | 6/2002 | Teng | 430/302 |
| 6,482,571 | B1 | 11/2002 | Teng | 430/302 |
| 6,576,401 | B2 | 6/2003 | Teng | 430/303 |
| 6,689,537 | B2 | 2/2004 | Urano et al. | 430/273.1 |
| 6,846,614 | B2 | 1/2005 | Timpe et al. | 430/281.1 |
| 7,189,494 | B2 | 3/2007 | Knight et al. | 430/281.1 |
| 7,368,215 | B2 | 5/2008 | Munnelly et al. | 430/157 |
| 2005/0196164 | A1 * | 9/2005 | Sasayama | 396/571 |
| 2005/0266349 | A1 | 12/2005 | Van Damme et al. | 430/300 |
| 2005/0271981 | A1 * | 12/2005 | Oohashi et al. | 430/300 |
| 2008/0076067 | A1 | 3/2008 | Vander et al. | 430/302 |
| 2008/0145789 | A1 | 6/2008 | Knight | 430/300 |

* cited by examiner

*Primary Examiner* — Joshua D. Zimmerman
*Assistant Examiner* — Shema T Freeman

(57) ABSTRACT

A method of processing an overcoat-free on-press developable lithographic printing plate with ink and/or fountain solution is described. The plate comprises on a substrate a photosensitive layer which is either capable of hardening (negative-working) or solubilization (positive-working) upon exposure to a laser, the non-hardened or solubilized areas of the photosensitive layer being soluble or dispersible in ink and/or fountain solution. The plate is exposed with a laser, heated to an elevated temperature, and then developed with ink and/or fountain solution on a lithographic press. The laser exposed plate is preferably heated by passing through a heating device or while mounted on a lithographic press before on-press development.

12 Claims, No Drawings

PROCESS FOR ON-PRESS DEVELOPING OVERCOAT-FREE LITHOGRAPHIC PRINTING PLATE

RELATED PATENT APPLICATIONS

This application is a continuation-in-part of U.S. patent application Ser. No. 12/236,485 filed Sep. 23, 2008, a continuation-in-part of U.S. patent application Ser. No. 11/604,603 filed Nov. 27, 2006 now U.S. Pat. No. 7,655,382, a continuation-in-part of U.S. patent application Ser. No. 11/645,376 filed Dec. 26, 2006, and a continuation-in-part of U.S. patent application Ser. No. 11/787,878 filed Apr. 17, 2007 now U.S. Pat. No. 7,752,966 that is a continuation-in-part of U.S. patent application Ser. No. 11/266,817 filed Nov. 4, 2005, now U.S. Pat. No. 7,213,516.

FIELD OF THE INVENTION

This invention relates to lithographic printing plates. More particularly, it relates to a method of processing an on-press ink and/or fountain solution developable lithographic plates wherein the laser exposed plate is applied with heat before on-press development.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation, optionally with further postexposure overall treatment. In positive-working systems, the exposed areas become more soluble and can be developed to reveal the underneath substrate. In negative-working systems, the exposed areas become hardened and the non-exposed areas can be developed to reveal the underneath substrate.

Traditionally, the plate is exposed with an ultraviolet light from a lamp through a separate photomask film having predetermined imaging pattern that is placed between the light source and the plate. Laser sources have been increasingly used to imagewise expose a printing plate that is sensitized to a corresponding laser wavelength, allowing the elimination of the photomask film. Suitable lasers include, for example, infrared lasers (such as laser diode of about 830 nm and NdYAG laser of about 1064 nm), visible lasers (such as frequency-doubled NdYAG laser of about 532 nm and violet laser diode of about 405 nm), and ultraviolet laser (such as ultraviolet laser diode of about 370 nm). Laser sensitive plates generally have higher sensitivity (than conventional plates) because of the limited power of current laser imagers.

Conventionally, the exposed plate is developed with a liquid developer to bare the substrate in the non-hardened or solubilized areas. On-press developable lithographic printing plates have been disclosed in recent years. Such plates can be directly mounted on press after imagewise exposure to develop with ink and/or fountain solution during the initial prints and then to print out regular printed sheets. No separate development process before mounting on press is needed, allowing the reduction of labor and the elimination of hazardous waste. Among the patents describing on-press developable lithographic printing plates are U.S. Pat. Nos. 5,258,263, 5,516,620, 5,561,029, 5,616,449, 5,677,110, 5,811,220, 6,014,929, 6,071,675, and 6,482,571.

While laser sensitive on-press developable plates have the advantage of not requiring a photomask film and not requiring a separate wet development process, such plates often have the drawbacks of insufficient laser sensitivity, insufficient durability, insufficient resolution, limited room light stability and/or weaker visible images. Also, it is hard to design a plate with combined good on-press developability, good photospeed, good durability and good resolution, because, for example, the factors which favor on-press developability often offset the small dots resolution, photospeed or durability. Furthermore, it is particularly hard to design an overcoat-free laser sensitive on-press developable lithographic plate with good photospeed; and the requirement of overcoat for laser sensitive on-press developable lithographic plate has been a major barrier for many manufacturers to make laser sensitive on-press developable plate, because most small to medium plate manufacturers currently do not have 2-layer coating facility which is needed for making a plate with overcoat. It would be desirable if the above drawbacks or problems could be eliminated through a simple prepress process which does not involve the use of chemicals.

The inventor has found that a simple heating method can be used for an overcoat-free lithographic plate after laser exposure and before on-press development to enhance or enable the hardening or solubilization of the exposed areas of the photosensitive layer so as to improve the performance or to allow proper performance of the plate.

SUMMARY OF THE INVENTION

According to the present invention, there has been provided a method of lithographically printing images on a receiving medium, comprising in order:

(a) providing a lithographic printing plate comprising on a substrate a photosensitive layer, wherein said photosensitive layer is capable of hardening (for negative-working plate) or solubilization (for positive-working plate) either upon exposure to a laser having a wavelength selected from 200 to 1200 nm or upon exposure to said laser followed by heating, the non-hardened or solubilized areas of said photosensitive layer are soluble or dispersible in ink and/or fountain solution, and said plate is free of any overcoat on said photosensitive layer;

(b) imagewise exposing said plate with said laser, to cause hardening or solubilization of the photosensitive layer in the exposed areas, or to cause activation of the photosensitive layer in the exposed areas so that such activated areas can be hardened or solubilized upon heating;

(c) overall heating said plate to an elevated temperature, to cause further hardening or solubilization of the exposed areas of said photosensitive layer, or to harden or solubilize the exposed areas of said photosensitive layer, without causing hardening or solubilization of the non-exposed areas of said photosensitive layer;

(d) developing said plate with ink and/or fountain solution on a lithographic press to remove the non-hardened (for negative-working) or solubilized (for positive-working) areas of said photosensitive layer; and (e) lithographically printing images from said plate to the receiving medium.

The plate is free of any overcoat on the photosensitive layer, so that the photosensitive layer is the topmost layer on the plate. In other words, the plate of this invention does not have any overcoat on the photosensitive layer. Preferably, the photosensitive layer is the only oleophilic layer on the plate. More preferably, the photosensitive layer is the only oleophilic layer on the plate and said substrate is a hydrophilically treated aluminum sheet.

Upon the above laser exposure and overall heating, the exposed areas of said photosensitive layer are hardened (for negative-working plate) or solubilized (for positive-working plate), the non-exposed areas of said photosensitive layer remain non-hardened or non-solubilized, and the non-hardened (for negative-working) or solubilized (for positive-working) areas of said photosensitive layer can be removed on press with ink and/or fountain solution. In one embodiment, the laser exposure causes hardening or solubilization of the photosensitive layer in the exposed areas, and the overall heating causes further hardening or solubilization of the photosensitive layer in the exposed areas. In another embodiment, the laser exposure activates the photosensitive layer in the exposed areas without causing hardening or solubilization, and the overall heating causes hardening or solubilization of the photosensitive layer in such activated areas. The activation by laser exposure causes a certain chemical or physical (preferably chemical) change in the exposed areas of the photosensitive layer so that such activated areas can be hardened or solubilized upon heating to an elevated temperature; preferably such an activation is the generation of a strong acid from a photoacid generator or a free radical from a free radical initiator, more preferably a strong acid from a photoacid generator, in the exposed areas of the photosensitive layer.

For negative-working plate, the photosensitive layer is capable of hardening upon exposure to a laser or upon exposure to a laser followed by heating, and the plate is then developed with ink and/or fountain solution on a lithographic press to remove the non-exposed areas (non-hardened areas) of the photosensitive layer, wherein the non-exposed areas of the photosensitive layer remain soluble or dispersible in ink and/or fountain solution and therefore removable on press with ink and/or fountain solution, and the exposed areas become hardened and therefore non-removable with ink and/or fountain solution. In one embodiment, the laser exposure causes hardening of the photosensitive layer in the exposed areas, while the overall heating causes further hardening (preferably further crosslinking) of the photosensitive layer in the exposed areas. In another embodiment, the laser exposure activates the photosensitive layer in the exposed areas without causing hardening, and the overall heating causes hardening of the photosensitive layer in such activated areas.

For positive-working plate, the photosensitive layer is capable of solubilization upon exposure to a laser or upon exposure to a laser followed by heating, and the plate is then developed with ink and/or fountain solution on a lithographic press to remove the exposed areas (solubilized areas) of the photosensitive layer; wherein the non-exposed areas of the photosensitive layer remain insoluble and nondispersible in and therefore non-removable with ink and/or fountain solution, and the exposed areas become soluble or dispersible in ink and/or fountain solution and therefore removable on press with ink and/or fountain solution. In one embodiment, the laser exposure causes solubilization of the photosensitive layer in the exposed areas, while the overall heating causes further solubilization of the photosensitive layer in the exposed areas (becoming more soluble or dispersible in and therefore more easily removable on press with ink and/or fountain solution). In another embodiment, the laser exposure activates the photosensitive layer in the exposed areas without causing solubilization, and the overall heating causes solubilizaton of the photosensitive layer in such activated areas.

The exposed plate, before on-press development, can be heated to any elevated temperature for any period of time as long as such heating does not cause hardening (for negative-working plate) or solubilization (for positive-working plate) of the non-exposed areas of the photosensitive layer. The plate is preferably heated to 50 to 200° C. for 1 to 240 seconds, more preferably 60 to 160° C. for 1 to 120 seconds, even more preferably 70 to 140° C. for 1 to 60 seconds, and most preferably 80 to 140° C. for 1 to 30 seconds.

The exposed plate can be heated to an elevated temperature by any method. Preferably the plate is heated by applying hot air, applying a radiation, or contacting with a hot plate; more preferably by applying forced hot air or applying a radiation; and most preferably by applying an infrared radiation. The radiation can be applied to the front (photosensitive layer-coated) side of the plate, the back side of the plate, or both the front and the back sides of the plate. The radiation applied to the front side of the plate should be such that it does not cause hardening (for negative-working) or solubilization (for positive-working) of the laser non-exposed areas of the photosensitive layer (at the intensity and dosage used). The radiation can be applied from various radiation sources, such as one or more infrared lamps or infrared tubes.

The heating of the exposed plate before on-press development can be conducted by any means. It can be conducted off press or on press. Preferably, the heating is conducted on a heating device off press such as in an oven or by passing through a heating device, or on a lithographic press. More preferably, the heating is conducted by passing through a heating device off press or with the plate mounted on the plate cylinder of a lithographic press. The heated plate is preferably cooled down to around room temperature before on-press development. For heating with a heating device off press, preferably, the heating device is connected to a laser imager, and the plate is imaged with the laser on the imager and then automatically transferred to the heating device. For heating with the plate mounted on the plate cylinder of a press, the plate cylinder is preferably rotating while a radiation or hot air is applied to the plate; preferably, the plate cylinder continues to rotate after the heating has stopped so as to help cool down the plate to around room temperature, before the plate is contacted with ink and/or fountain solution for on-press development.

The plate can be heated under any lighting (including darkness) which does not cause hardening or solubilization of the non-exposed areas of the photosensitive layer. Preferably, the plate is heated in substantial darkness or under a yellow-red light, such as in a yellow-red light room or within light-tight covers. More preferably, the plate is heated by passing through a heating device with covers that are non-transparent or only transparent to yellow-red light so that the plate on the device is in substantial darkness or under yellow-red light, or is heated while mounted on a lithographic press with covers that are non-transparent or only transparent to yellow-red light so that the plate on the press is in substantial darkness or under yellow-red light; the heating device or press is preferably in a white light room. Most preferably, the plate is heated by passing through a heating device with non-transparent covers so that the plate on the device is in darkness or substantial darkness, or is heated while mounted on a lithographic press with non-transparent covers so that the plate on the press is in darkness or substantial darkness; the heating device or press is preferably in a white light room.

The laser used in this invention can be any laser with a wavelength selected from 200 to 1200 mm which, with or without further heating, is capable of causing hardening or solubilization of the photosensitive layer. Such a laser is preferably an infrared laser (750 to 1200 nm) or a violet or ultraviolet laser (200 to 430 nm), more preferably a violet or ultraviolet laser (200 to 430 nm), and most preferably a violet laser (390 to 430 nm).

DETAILED DESCRIPTION OF THE PREFERRED EMBODIMENTS

Some terms or phrases as used in this patent application are defined in the following 5 paragraphs.

The term hardening means (the photosensitive layer) becoming insoluble and non-dispersible in and non-removable on press with ink and/or fountain solution (during on-press development). The term further hardening means (the photosensitive layer) becoming even more hardened (such as having higher crosslinking density) so that it is more durable on press or has better small dots resolution. The term solubilization means (the photosensitive layer) becoming soluble or dispersible in and on-press removable with ink and/or fountain solution. The term further solubilization means (the photosensitive layer) becoming more soluble or dispersible in ink and/or fountain solution so that the photosensitive layer in such exposed areas becomes more easily removable on press with ink and/or fountain solution.

The term yellow-red light means a yellow light, a red light, or any light with color between yellow and red, such as an orange light; the yellow-red light preferably contains no substantial radiation with wavelengths below a wavelength selected from 400 to 650 rm. Suitable yellow-red light includes a light that is from a fluorescent or incandescent lamp that is covered with a filter that cuts off substantially all (preferably all) of the radiation below a wavelength selected from 400 to 650 nm. Such a cut off wavelength can be 400, 450, 500, 550, 600 or 650 nm, or any wavelength between 400 and 650 nm, depending on the spectral sensitivity of the plate. Preferably, the yellow-red light contains no substantial radiation below 450 nm, more preferably no substantial radiation below 500 nm, and most preferably no substantial radiation below 530 nm. Various yellow-red lamps are commercially available (such as from EncapSulite International Inc. and General Electric), and can be used for the instant invention.

A white light can be a regular fluorescent light, a regular incandescent light, sunlight, any regular office light, or any light with broad spectrum over at least the whole visible region (about 380 to 750 nm). A white light (such as from an office fluorescent lamp) with addition of a yellow-red light (such as from a yellow light lamp) is also considered a white light in this application, because such light has broad spectrum over the whole visible region. Preferred while light is a regular fluorescent light or a regular incandescent light, with or without addition of sunlight from the windows. More preferred white light is a regular fluorescent light.

The term "substantial darkness" or "no substantial radiation" means a lighting (including darkness) with lower than 1% of the light intensity for all wavelengths for a 100-watt regular tungsten incandescent lamp (also called tungsten lamp or incandescent lamp) at a distance of 2 meters. The term "substantially no radiation below a wavelength" means the intensity of the radiation below that wavelength is lower than 1% of the radiation below that wavelength for a 100-watt tungsten lamp at 2 meters. The term "substantial radiation" means the tight intensity is higher than 1% of the radiation for a 100-watt tungsten lamp at 2 meters. The term "substantial radiation for certain wavelengths" means the light intensity for such wavelengths is higher than 1% of a 100-watt tungsten lamp at 2 meters for such wavelengths. The term "substantially light-tight" means that less than 1% of light can pass through. The term "substantially all" or "substantially the entire" means at least 99% of all.

The term monomer includes both monomer and oligomer, and the term (meth)acrylate includes both acrylate and methacrylate (A monomer means a monomer or an oligomer, and a (meth)acrylate monomer means an acrylate monomer, a methacrylate monomer, or a monomer with both acrylate and methacrylate groups). The term "comprises a . . . " means "comprises at least one . . . ", for example, the term "comprising a monomer" means "comprising at least one monomer."

For the lithographic printing plate of this invention, at least the hardened (negative-working) or non-solubilized (positive-working) areas of the photosensitive layer exhibit an affinity or aversion substantially opposite to the affinity or aversion of the substrate to at least one printing liquid selected from the group consisting of ink and an adhesive fluid for ink. Here, the photosensitive layer can have the same affinity or aversion as the substrate and change to opposite affinity or aversion upon laser exposure followed by heating, with or without further treatment such as contacting with ink and/or fountain solution, phase change type plate); or can have opposite affinity or aversion to the substrate both before and after laser exposure followed by heating (non-phase change type plate). Preferably, the photosensitive layer exhibits an affinity or aversion substantially opposite to the affinity or aversion of the substrate (non-phase change type plate, including waterless plate and wet plate). More preferably, the photosensitive layer is oleophilic (and hydrophobic) and the substrate is hydrophilic (wet plate). An adhesive fluid for ink is a fluid that repels ink; fountain solution is the most commonly used adhesive fluid for ink.

Usually, as for most printing plates described in the literature, the photosensitive layer exhibits an affinity or aversion substantially opposite to the affinity or aversion of the substrate to at least one printing liquid selected from the group consisting of ink and an adhesive fluid for ink (fountain solution is a preferred adhesive fluid for ink), and does not switch its affinity or aversion upon laser exposure. However, certain photosensitive layer exhibits substantially the same affinity or aversion as the substrate and is capable of switching to opposite affinity or aversion upon exposure to an actinic radiation (with or without further treatment), as described in U.S. Pat. Nos. 6,331,375, 5,910,395, 6,720,464, and 6,136,503. Both non-phase-switchable photosensitive layer and phase-switchable photosensitive layer can be used for the current invention. Preferred is a non-phase-switchable photosensitive layer (coated on a substrate with opposite affinity or aversion). More preferred is an oleophilic photosensitive layer (coated on a hydrophilic substrate).

The substrate employed in the lithographic plates of this invention can be any lithographic support. Such a substrate may be a metal sheet, a polymer film, or a coated paper. Aluminum (including aluminum alloy) sheet is a preferred metal support. Particularly preferred is an aluminum support that has been grained and anodized (with or without deposition of a barrier layer). Polyester film is a preferred polymeric film support. A surface coating may be coated to achieve desired surface properties. For wet plate, the substrate should have a hydrophilic or oleophilic surface, depending on the surface properties of the photosensitive layer; commonly, a wet lithographic plate has a hydrophilic substrate and an oleophilic photosensitive layer. For waterless plate, the substrate should have an oleophilic or oleophobic surface, depending on the surface properties of the photosensitive layer.

Particularly suitable hydrophilic substrate for a wet lithographic plate is an aluminum support that has been grained and anodized; such a substrate is preferably further deposited with a hydrophilic barrier layer. Surface graining (also called roughening) can be achieved by mechanical graining or brushing, chemical etching, and/or electrochemical graining; preferably by electrochemical graining. The roughened surface is preferably further anodized to form a durable aluminum oxide surface using an acid electrolyte such as sulfuric acid and/or phosphoric acid. The roughened and anodized aluminum surface is preferably further treated with a hydrophilic material to form a hydrophilic barrier layer. Suitable hydrophilic materials include metal silicate such as sodium silicate, phosphate fluoride (formed from a solution containing sodium dihydrogen phosphate and sodium fluoride, called phosphate fluoride solution), and hydrophilic polymer such as polyvinyl phosphonic acid, polyacrylamide, polyacrylic acid, polybasic organic acid, copolymers of vinyl phosphonic acid and acrylamide. Polyvinyl phosphonic acid and its copolymers are preferred polymers. The hydrophilic material can be formed on the aluminum surface by thermal or electrochemical method, preferably by thermal method. By thermal method, the grained and anodized aluminum passes through or is immersed for a certain time in a solution containing the hydrophilic material at a certain temperature including elevated and room temperature. By electrochemical method, a DC or AC electricity is applied to the aluminum while passing through or immersed in the solution containing the hydrophilic material. Processes for forming a hydrophilic barrier layer on aluminum in lithographic printing plate application are well known in the art, and examples can be found in U.S. Pat. Nos. 2,714,066, 4,153,461, 4,399,021, 5,368,974, and 6,555,205. The aluminum substrate preferably has an average surface roughness Ra of from 0.1 to 1.0 μm, more preferably from 0.2 to 0.6 μm, and most preferably from 0.3 to 0.5 μm.

For preparing lithographic printing plates of the current invention, any photosensitive layer is suitable which is capable of hardening (for negative-working plate) or solubilization (for positive-working plate) upon exposure to a laser having a wavelength selected from 200 to 1200 nm with or without further heating, and is soluble or dispersible in ink and/or fountain solution in the non-hardened or solubilized areas. Here hardening means becoming insoluble and non-dispersible in ink and/or fountain solution (negative-working), and solubilization means becoming soluble or dispersible in ink and/or fountain solution (positive-working). In this invention, hardening can be achieved through any means, including chemical reactions (such as polymerization, crosslinking, and chemical changes of monomer, polymer or compound) and physical changes (such as coalescence of polymer particles); preferably, hardening is achieved through chemical reaction (such as polymerization, crosslinking, or chemical change); more preferably, hardening is achieved through crosslinking or polymerization of the resins (polymers and/or monomers); most preferably, hardening is achieved through polymerization of the monomers. Solubilization in this invention can be achieved through any means; preferably, solubilization is achieved through decomposition of the resins or their functional groups. A laser sensitizing dye is preferably added in the photosensitive layer. The photosensitive layer preferably has a coverage of from 100 to 3000 $mg/m^2$, more preferably from 300 to 2000 $mg/m^2$, and more preferably from 500 to 1500 $mg/m^2$.

Photosensitive layers suitable for the current invention may be formulated from various photosensitive materials, usually with addition of a sensitizing dye or pigment. The composition ratios (such as monomer to polymer ratio) are usually different from conventional plates designed for development with a regular liquid developer. Various additives may be added to, for example, allow or enhance on-press developability. Such additives include surfactant, plasticizer, water soluble polymer or small molecule, and ink soluble polymer or small molecule. The addition of nonionic surfactant is especially helpful in making the photosensitive layer dispersible with ink and fountain solution, or emulsion of ink and fountain solution. Various additives useful for conventional photosensitive layer can also be used. These additives include pigment, dye, exposure indicator, and stabilizer.

Photosensitive materials useful for negative-working wet plates of this invention include, for example, photosensitive compositions comprising an acrylic monomer, a polymeric binder and a photoinitiator; a photosensitive compositions comprising a polyfunctional vinyl ether or epoxy monomer and a cationic photoinitiator; photosensitive compositions comprising a polymer with crosslinkable groups and a crosslinking agent; and polycondensation products of diazonium salts. A laser sensitizing dye is preferably added.

Photosensitive materials useful for positive-working wet plates of this invention include, for example, compositions comprising a diazo-oxide compound (such as benzoquinone diazide and naphthoquinone diazide), a novalac resin and a sensitizing dye; and positive-working composition comprising a novalac resin and a sensitizing dye (such as an infrared absorbing dye).

Photosensitive materials useful in wet plates of this invention include, for example, photosensitive compositions comprising an oleophilic polymeric binder, a polymerizable monomer, an initiator, and a sensitizing dye.

Photosensitive oleophobic materials useful in waterless plates of this invention include, for example, compositions comprising a monomer having perfluoroalkyl or polysiloxane groups and crosslinkable terminal groups, an initiator, and a sensitizing dye.

Infrared laser sensitive (thermosensitive) materials useful for thermosensitive lithographic plates of this invention include, for example, thermosensitive compositions comprising a polymerizable monomer, an initiator, an infrared absorbing dye, and optionally a polymeric binder. Also useful thermosensitive materials are infrared sensitive compositions comprising a crosslinkable polymer and an infrared absorbing dye or pigment. Yet useful thermosensitive materials are infrared sensitive compositions comprising a polymer with crosslinkable groups (such as hydroxyl or carboxyl groups), a crosslinking agent (such as a melamine resin), and an infrared absorbing dye or pigment, preferably with addition of a latent catalyst (such as a photoacid generator). Further useful thermosensitive materials are infrared sensitive compositions comprising a polymer or compound capable of becoming insoluble upon heat and an infrared absorbing dye or pigment. Yet further useful thermosensitive materials are infrared sensitive compositions comprising a polymeric particulate dispersion and an infrared absorbing dye or pigment.

Visible (including violet) laser sensitive materials useful for visible laser sensitive lithographic plates of this invention include, for example, photosensitive compositions comprising a polymerizable monomer, an initiator, a visible light sensitizing dye, and optionally a polymeric binder.

Violet or ultraviolet laser sensitive materials useful for violet laser sensitive plates of this invention include, for example, photosensitive compositions comprising a polymerizable monomer, an initiator, a violet or ultraviolet sensitizing dye, and optionally a polymeric binder; a hydrogen donor is preferably added to accelerate the polymerization. Also useful violet or ultraviolet laser sensitive materials are photosensitive materials comprising a polymer with crosslinkable groups (such as hydroxyl or carboxyl groups), a crosslinking agent (such as a melamine resin), a latent catalyst (such as a photoacid generator), and a violet or ultraviolet sensitizing dye.

Polymeric binder for the photosensitive layer of this invention can be any solid film-forming polymer. Such polymer may or may not have (meth)acrylate groups or other ethylenic groups (such as allyl groups). Examples of suitable polymeric binders include (meth)acrylic polymers and copolymers (such as polybutylmethacrylate, polyethylmethacrylate, polymethylmethacrylate, polymethylacrylate, butylmetharylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl acetal (such as polyvinyl butyral), polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, polyurethane binder, polymeric binder having acetoacetate groups (such as the acetoacetylated polymers as described in U.S. Pat. Nos. 6,919,416 and 7,001,958), and polymeric binder having polymer backbone with recurring units having pendant poly(alkylene glycol) side chains.

Suitable free-radical polymerizable monomers include any monomer or oligomer with at least one ethylenically unsaturated group. Such monomers include monofunctional, difunctional, and multifunctional (meth)acrylate monomers or oligomers, such as (meth)acrylate esters of ethylene glycol, trimethylolpropane, pentaerythritol, ethoxylated ethylene glycol and ethoxylated trimethylolpropane; multifunctional urethanated (meth)acrylate; epoxylated (meth) acrylate; oligomeric amine (meth)acrylate; and phosphate ester-containing (meth)acrylate (such as phosphate ester of 2-hydroxyethyl methacrylate, and various phosphate ester coning (meth)acrylate monomers as described in U.S. Pat. Nos. 4,101,326, 5,679,485, 5,776,655 and 7,316,887, and U.S. Pat. App. No. 2008/0008957). The monomers can be urethane (meth)acrylate, or non-urethane (meth)acrylate. Combination of both urethane (meth)acrylate and non-urethane (meth)acrylate monomers can be used. The monomers preferably has at least 3 (meth)acrylate groups, more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the photosensitive layer having multifunctional (meth)acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group.

Urethane (meth)acrylate monomers include any compounds having at least one urethane linkage (—NHCOO—) and at least one (meth)acrylate group. Preferred urethane (metha)acrylate monomers are those with at least 3 (meth) acrylate groups, more preferably at least 4 (meth)acrylate groups, even more preferably at least 5 (meth)acrylate groups, and most preferably at least 6 (meth)acrylate groups. Urethane (meth)acrylate monomer is usually formed by reacting a compound having at least one isocyanate group with a (meth)acrylate compound having a hydroxy group. Urethane monomer with 2 or more (meth)acrylate groups are usually formed from a compound having one or more isocyanate groups and a (meth)acrylate compound having a hydroxy group and one or more (meth)acrylate groups. For example, a tetrafunctional urethane (meth)acrylate monomer can be formed from a compound having one hydroxy group and 2 (methacrylate groups with a bifunctional isocyanate compound. Suitable isocyanate compounds include, for example, aromatic diisocyanate such as p-phenylene diisocyanate, 2,4-tolylene diisocyanate, 2,6-tolylene diisocyanate, 4,4'-diphenylmethane diisocyanate, 2,4'-diphenylmethane diisocyanate, 2,2'-diphenylmethane diisocyanate, and naphthalene-1,5-diisocyanate; aliphatic diisocyanate such as hexamethylene diisocyanate, lysinemethyl ester diisocyanate, 2,4,4-trimethylhexamethylene diisocyanate and dimer acid diisocyanate; alicyclic diisocyanate such as isophorone diisocyanate, and 4,4'-methylenebis(cyclohexylisocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatephenyl)thiophosphate; and polyisocyanate formed from condensation of three or more diisocyanate compounds such as 2,4-tolylene diisocyanate isocyanurate trimer, 2,4-tolylene diisocyanate-trimethylolpropane adduct and 1,6-hexanediisocyante isocyanurate trimer. Suitable (meth)acrylate compounds with one hydroxy group include pentaerythritol tri(meth)acrylate, dipentaerythritol penta(meth)acrylate, ditrimethylolpropane tri(meth)acrylate and pentaerycitol di(meth)acrylate monostearate. Various urethane (meth)acrylate monomers are described in U.S. Pat. No. 6,232,038 and U.S. Pat. Pub. No. 2002/0018962, and can be used as the urethane (meth)acrylate monomers of this instant invention. Among the urethane (meth)acrylate monomers, urethane acrylate monomer is preferred. Either aromatic urethane (meth)acrylate monomer (which contains at least one aromatic group in the molecule) or aliphatic urethane (meth) acrylate monomer (which does not contain any aromatic group in the molecule) or both can be used in a photosensitive layer of this invention.

Suitable non-urethane (meth)acrylate monomers can be any (meth)acrylate monomers without urethane linkage (—NHCOO—) in the molecule. Suitable non-urethane (meth)acrylate monomers include, for example, trimethylolpropane triacrylate, pentaerythritol tetra(meth)acrylate, dipentaerythritol penta(meth)acrylate, dipentaerythritol hexa (meth)acrylate, di(trimethylolpropane) tert(meth)acrylate. Among the non-urethane (methacrylate monomers, non-urethane acrylate monomer is preferred.

The free radical initiators useful for the photosensitive layer of this invention include any initiators capable of generating free radicals or other activating species to cause polymerization of the monomers upon exposure to a laser having a wavelength selected from 200 to 1200 nm, with or without the presence of a sensitizing dye. Suitable free-radical initiators include, for example, onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate, bis(4-t-butylphenyl)iodonium hexafluorophosphate, triarylsulfonium hexafluorophosphate, triarylsulfonium p-toluenesulfonate, (3-phenylpropan-2-onyl) triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium tiphenyl(n-butyl)borate, diphenyliodonium tetraphenylborate, and triphenylsulfonium triphenyl(n-butyl) borate, and the borate salts as described in U.S. Pat. Nos. 6,232,038 and 6,218,076; haloalkyl substituted s-triazines such as 2,4-bis(trichloromethyl)-6-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxyelhylenoxy)-phen-1-yl]-s-triazine, and the s-triazines as described in U.S. Pat. Nos. 5,955,238, 6,037,098, 6,010,824 and 5,629,354; hexaarylbiimidazole compounds such as 2,2'-bis(2-chlorophenyl)-4,4',5,5'-tetraphenyl-1,1'-biimidazole, 2,2'-bis(2-ethoxyphenyl)-4,4',5,5'-tetraphenyl-1,1'-biimidazole, 2,2',4-tris(2-chlorophenyl)-5-(3,4-dimethoxyphenyl)-4',5'-diphenyl-1,1'-biimidazole, and 2-(1-naphthyl)-4,5-diphenyl-1,2'-biimidazole; and titanocene compounds such as bis($\eta^9$-2,4-cyclopentadien-1-yl) bis[2,6-difluoro-3-(1H-pyrrol-1-yl)phenyl) titanium. For thermosensitive plate, onium salts, borate salts, and s-triazines are preferred free radical initiators; onium salts and borate salts are more preferred; and onium salts (particularly diaryliodonium salts and triarylsulfonium salts) are most preferred. For violet or ultraviolet plate, hexaarylbiimidazole compounds and titanocene compounds are preferred free radical initiators, and hexaarylbiimidazole compounds are more preferred. One or more initiators can be added in a photosensitive layer. The initiator is added in the photosensitive layer preferably at 0.5 to 40% by weight of the photosensitive layer, more preferably at 2 to 30%, and most preferably at 5 to 20%.

Suitable polyfunctional epoxy monomers include, for example, 3,4-epoxycyclohexylmethyl-3,4-epoxycyclohexane carboxylate, bis-(3,4-epoxycyclohexymethyl)adipate, difunctional bisphenol A/epichlorohydrin epoxy resin and multifunctional epichlorohydrin/tetraphenylol ethane epoxy resin.

Suitable cationic initiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Bronsted acid, they also generate free radicals during photo or thermal decomposition.

Photoacid generators are compounds capable of generating a Bronsted acid (preferably a strong acid) upon exposure with a certain radiation (preferably a laser), with or without the presence of a sensitizing dye. It is noted that photoacid generator is one type of cationic initiators because free acid is one type of cations. Preferred photoacid generators are onium salts, such as triarylsulfonium hexafluoroantimonate, triarylsulfonium hexafluorophosphate, diaryliodonium hexafluoroantimonate, and diaryliodonium hexafluorophosphate; borate salts, such as diaryliodonium triarylmonoalkylborate, and diaryliodonium tetraarylborate; and haloalkyl substituted s-triazine, such as 2,4-bis(trichloromethyl)-6-(p-methoxystyryl)-s-triazine, 2,4-bis(trichloromethyl)-6-(4-methoxynaphth-1-yl)-s-triazine, 2,4-bis(trichloromethyl)-6-piperonyl-s-triazine, and 2,4-bis(trichloromethyl)-6-[(4-ethoxyethylenoxy)-phen-1-yl]-s-triazine.

Amino resins suitable for this invention include any melamine resins, urea resins, benzoguanamine resins and glycoluril resins capable of crosslinking with a polymer having certain functional groups (preferably hydroxyl groups, carboxyl groups, amide groups or thiol groups), preferably in the presence of a strong acid, with or without heating. Various amino resins as described in the literature or commercial brochures can be used as the crosslinking agent of this invention. Examples of literature describing amino resins are Chapter VI ("Amino Resins") of the book entitled "Organic Coatings: Science and Technology" by Zeno W. Wicks, Jr., Frank N. Jones and S. Peter Pappas, John Wiley & Sons, New York (1992); and the technical brochures on amino resin products by INEOS Melamines, Inc. and by Cytec Surface Specialties (published in the internet). Among the amino resins, melamine resins are particularly useful.

Suitable melamine resins in the present invention are compounds with two or more (preferably three or more) methylol groups or alkoxymethyl groups in a melamine molecule or a condensation polymer of melamine molecules. Examples of melamine resins are dimethylolmelamine, trimethylolmelamine, tetramethylolmelamine, pentamethylolmelamine, hexamethylolmelamine, dimethoxymethyl-dimethylol-melamine, dimethoxymethyl-trimethylol-melamine, trimethoxymethyl-dimethylol-melamine, methoxymethyl-methylol-melamine, methoxymethyl-tetramethylol-melamine, methoxymethyl-pentamethylol-melamine, dimethoxymethyl-tetramethylol-melamine, trimethoxymethyl-trimethylol-melamine, tetramethoxymethyl-dimethylol-melamine, pentamethoxymethyl-methylol-melamine, hexamethoxymethyl melamine, as well as mixtures of these melamine compounds. Examples of the specific commercially available products of melamine resins are those from INEOS Resimenes, Inc. (such as Resimene 2040, Resimene 718, Resimene 730, Resimene 735, Resimene 741, Resimene 745, Resimene 747, Resimene 750, Resimene 751, Resimene 755, Resimene 757, Resimene 758, Resimene 797, Resimene 881, Resimene 891, Resimene AQ7550, Resimene BM5901, ResimeneBM5905, Resimene CE2202, Resimene CE6517, Resimene CE6550, Resimene CE7103, Resimene CE7504, Resimene CE7511, Resimene HM8205 and Resimene HM8205) and those from Cytec Surface Specialties (such as Cymel 301, Cymel 303 LF, Cymel MM-100, Cymel 1130, Cymel 1133, Cymel 1156, Cymel 1170, Cymel 1171, Cymel 370, Cymel 325, Cymel 327, Cymel 328, Cymel 350, Cymel 202, Cymel 1123, Cymel 659, Cymel 3745 and Cymel U-80).

Polymers or compounds capable of crosslinking with an amino resin include any polymers or compounds with two or more functional groups capable of crosslinking with an amino resin. Particularly useful are polymers having hydroxyl, carboxyl, amide and thiol groups, especially hydroxyl groups. Examples of such crosslinkable polymers include (meth)acrylate polymers having hydroxyl groups (such as a methyl methacrylate/methacrylic acid copolymer further reacted with an epoxide compound), (meth)acrylate/(meth)acrylic acid copolymers (such as a copolymer of methyl methacrylate and methacrylic acid), (meth)acrylate/(meth)acrylamide copolymers (such as a copolymer of methyl methacrylate and methacrylamide), polyvinyl acetal (with both acetal and hydroxyl groups, as in typical commercial polyvinyl acetal products), partially hydrolyzed polyvinyl acetate, and polyvinyl butyral having butyral and hydroxyl groups. Particularly useful crosslinkable polymers are polyvinyl actetal having both acetal and hydroxyl groups, polyvinyl acetal having acetal, hydroxyl and acetate groups, polyvinyl butyral having both butyral and hydroxyl groups, polyvinyl butyral having butyral, hydroxyl and acetate groups, and partially hydrolyzed polyvinyl acetate.

Suitable sensitizing dyes in this invention include any compounds capable of absorbing a laser radiation and transferring the absorbed laser energy to an initiator, photoacid generator or other component in the photosensitive layer to cause hardening, solubilization, or activation of the photosensitive layer in the exposed areas. Preferred sensitizing dyes are infrared sensitizing dyes (also called infrared absorbing dyes), visible sensitizing dyes (including violet sensitizing dyes), and ultraviolet sensitizing dyes. More preferred are infrared laser absorbing dyes and violet or ultraviolet laser sensitizing dyes.

Infrared absorbers useful in the thermosensitive layer of this invention include any infrared absorbing dye or pigment effectively absorbing an infrared radiation having a wavelength of 700 to 1,500 nm. It is preferable that the dye or pigment having an absorption maximum between the wavelengths of 750 and 1,200 nm. Various infrared absorbing dyes or pigments are described in U.S. Pat. Nos. 5,858,604, 5,922,502, 6,022,668, 5,705,309, 6,017,677 and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. Examples of useful infrared absorbing pigments include black pigments, metal powder pigments, phthalocyanine pigments, and carbon black. Carbon black is a preferred infrared absorbing pigment. Mixtures of dyes, pigments, or both can also be used. Infrared absorbing dye is preferred over infrared absorbing pigment because infrared absorbing dye usually has higher absorbing efficiency, gives less visible color, and allows molecular level charge or energy transfer to activate the initiator. The infrared dye or pigment is added in the thermosensitive layer preferably at 0.01 to 20% by weight of the thermosensitive layer, more preferably at 0.1 to 10%, and most preferably at 0.5 to 5%.

Visible or ultraviolet (including violet) sensitizing dyes useful in the visible or ultraviolet sensitive photosensitive layer of this invention include any dyes capable of absorbing a visible or ultraviolet radiation (200 to 600 nm) and transferring the absorbed energy to an initiator, photoacid generator or other component in the photosensitive layer to cause hardening, solubilization, or activation of the photosensitive layer in the exposed areas. Visible or ultraviolet sensitizing dyes preferably have an absorption wavelength maximum of from 200 to 600 nm; violet laser (390 to 430 nm) sensitizing dyes preferably have an absorption wavelength maximum of form 350 to 450 nm, more preferably from 380 to 430 nm, and most preferably from 390 to 420 nm. Suitable visible or ultraviolet sensitive dyes include, for example, cyanine dyes (including polymethine dyes); rhodamine compounds such as rhodamine 6G perchloride; chromanone compounds such as 4-diethylaminobenzilidene chromanone; dialkylaminobenzene compounds such as ethyl 4-dimethylaminobenzoate and dialkylaminobenzene; dialkylaminobenzophenone compounds such as 4,4'-bis(dimethylamino)benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminophenyl)-1,3,4-oxazole, 2-(dimethylaminophenyl)benzothiazole, 2-diethylaminophenyl)benzothiazole, 2-(p-dimethylaminophenyl)benzimidazole, 2-(p-diethylaminophenyl)benzimidazole, 2,5-bis(p-diethylaminophenyl)-1,3,4-thiadiazole, (p-dimethylaminophenyl)pyridine, diethylaminophenyl)pyridine, 2-dimethylaminophenyl)quinoline, 2-(p-diethylaminophenyl)quinoline, 2-+dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds and bis(dialkylamino)benzophenone compounds are particularly suitable for ultraviolet laser sensitive plate. Bis(dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The visible or ultraviolet sensitizing dye is added in the photosensitive layer preferably at 0.1 to 20% by weight of the photosensitive layer, more preferably 0.5 to 15%, and most preferably 1 to 10%.

The photosensitive layer of the present invention may contain one or more hydrogen donors as a polymerization accelerator. Examples of the hydrogen donors include compounds having a mercapto group (also called mercapto compounds) such as 2-mercaptobenzothiazole, 2-mercaptobenzimidazole, 2-mercaptobenzoxazole and 3-mercapto-1,2,4-triazole; and N-aryl-α-amino acids, their salts and esters such as N-phenylglycine, salts of N-phenylglycine, and alkyl esters of N-phenylglycine such as N-phenylglycine ethyl ester and N-phenylglycine benzyl ester. Preferred hydrogen donors are mercapto compounds (more preferably 2-mercaptobenzothiazole, 2-mercaptobenzimidazole, 2-mercaptobenzoxazole, and 3-mercapto-1,2,4-triazole) and N-aryl-α-amino acids and their derivatives (more preferably N-phenylglycine, N-phenylglycine ethyl ester, and N-phenylglycine benzyl ester), most preferred hydrogen donors are mercapto compounds. Combination of at least one mercapto compound and at least one N-aryl-α-amino acid or its ester or salt can be advantageously used in the photosensitive layer to increase the photospeed. The hydrogen donor is added in the photosensitive layer preferably at 0.01 to 15% by weight of the photosensitive layer, more preferably 0.1 to 10%, and most preferably 0.5 to 5%.

Various surfactants can be added into the photosensitive layer to allow or enhance the on-press developability with ink and/or fountain. Both polymeric and small molecule surfactants can be used. However, it is preferred that the surfactant has low or no volatility so that it will not evaporate from the photosensitive layer of the plate during storage and handling. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the photosensitive layer, more preferably from 0.5 to 20%, and most preferably from 1 to 10%.

A hydrophilic or oleophilic micro particles can be added into the photosensitive layer to enhance, for example, the developability and non-tackiness of the plate. Suitable micro particles include polymer particles, talc, titanium dioxide, barium sulfate, silicone oxide, finned silica, treated firmed silica, and aluminum micro particles, with an average particle size of less than 10 microns, preferably less than 5 microns, more preferably less than 2 microns, and most preferably less than 1 microns. A suitable particulate dispersion is described in U.S. Pat. No. 6,071,675, the entire disclosure of which is hereby incorporated by reference.

For plates with rough and/or porous surface, a thin releasable interlayer can be deposited between the substrate and the photosensitive layer. Preferably, the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. The water-soluble polymer is generally coated from an aqueous solution with water as the only solvent. A water-soluble organic solvent, preferably an alcohol such as ethanol or isopropanol, can be added into the water-soluble polymer aqueous coating solution to improve the coatability. The alcohol is preferably added at less than 40% by weight of the solution, more preferably at less than 20%, and most preferably at less than 10%. The releasable interlayer preferably has an average coverage of 1 to 200 $mg/m^2$, more preferably 2 to 100 $mg/m^2$, and most preferably 4 to 40 $mg/m^2$. The substrate preferably has an average surface roughness Ra of 0.2 to 2.0 microns, and more preferably 0.4 to 1.0 microns.

The photosensitive layer can be conformally coated onto a roughened substrate (for example, with Ra of larger than 0.4 microns) at thin coverage (for example, of less than 1.2 $g/m^2$) so that the plate can have microscopic peaks and valleys on the photosensitive layer coated surface and exhibit low tackiness and good block resistance, as described in U.S. Pat. No. 6,242,156, the entire disclosure of which is hereby incorporated by reference.

A preferred negative-working thermosensitive layer comprises a polymeric binder, a free radical polymerizable monomer having at least one terminal ethylenic group, a free-radical initiator, and an infrared absorbing dye. A nonionic surfactant is preferably added. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. The monomer preferably has at least 3 (meth) acrylate groups, more preferably at least 4 (meth)acrylate groups, even more preferably at least 5 (meth)acrylate groups, and most preferably at least 6 (meth)acrylate groups. The monomer can be a urethane (meth)acrylate monomer or a non-urethane (meth)acrylate monomer; preferably the monomer is a urethane (meth)acrylate monomer; more preferably both a non-urethane (meth)acrylate monomer and a urethane (meth)acrylate monomer are used in the photosensitive layer. One or more other monomers can also be added. The weight ratio of all the monomers to all the polymeric binders is preferably larger than 0.5, more preferably larger than 1.0, even more preferably larger than 1.5, and most preferably larger than 2.0.

Another preferred negative-working thermosensitive layer comprises a polymeric binder, a urethane monomer having at least 3 (meth)acrylate groups, a non-urethane monomer having at least 3 (meth)acrylate groups, a free-radical initiator, and an infrared absorbing dye. Preferably, the urethane monomer has at least 4 (met)acrylate groups, and the non-urethane monomer has at least 4 (meth)acrylate groups. More preferably, the urethane monomer has at least 6 (meth)acrylate groups. A nonionic surfactant is preferably added. One or more other monomers can be added. The weight ratio of all the urethane (meth)acrylate monomer to all the non-urethane (meth)acrylate monomer is preferably from 0.10 to 10.0, more preferably 0.30 to 1.0.

A third preferred negative-working thermosensitive layer comprises a polymeric binder having polymer backbone with recurring units having pendant poly(alkylene glycol) side chains, a (meth)acrylate monomer having at least one (meth) acrylate group, a free-radical initiator, and an infrared absorbing dye, A mercapto group-containing compound is preferably added. The weight ratio of all the monomers to all the polymeric binders is preferably at least 1.0, more preferably from 1.5 to 6.0, and most preferably from 2.0 to 5.0.

A fourth preferred negative-working thermosensitive layer comprises a polymeric binder, a urethane (meth)acrylate monomer having at least 4 (meth)acrylate groups, a phosphate ester-containing (meth)acrylate monomer, a free-radical initiator, and an infrared absorbing dye. A mercapto group-containing compound is preferably added. The weight ratio of all the monomers to all the polymeric binders is preferably at least 1.0, more preferably from 1.5 to 6.0, and most preferably from 2.0 to 5.0.

A fifth preferred negative-working thermosensitive layer comprises an epoxy or vinyl ether monomer having at least one epoxy or vinyl ether group (preferably an epoxy monomer having at least 2 epoxy groups), a photoacid generator, and an infrared absorbing dye or pigment (preferably infrared absorbing dye). A polymeric binder is preferably added. Other additives such as surfactant, dye or pigment, exposure-indicating dye, and acid quencher (usually an alkaline compound, such as tetrabutylammonium hydroxide or triethylamine) may be added.

A sixth preferred negative-working thermosensitive layer comprises a polymeric binder and an infrared absorbing dye or pigment (preferably infrared absorbing dye); here the thermosensitive layer is developable with ink and/or fountain solution and capable of hardening through crosslinking of the polymeric binder upon exposure to an infrared laser. A nonionic surfactant and/or a water-soluble polymer are preferably added. Other additives such as other surfactant, dye or pigment, and exposure indicating dye can also be added.

A seventh preferred negative-working thermosensitive layer comprises a polymeric particulate dispersion and an infrared absorbing dye or pigment (preferably infrared absorbing dye); here the thermosensitive layer is developable with ink and/or fountain solution and capable of hardening through coalescence of the polymer particles upon exposure to an infrared laser. A nonionic surfactant and/or a water-soluble polymer are preferably added. Other additives such as other surfactant, dye or pigment and exposure indicating dye can also be added.

A eighth preferred negative-working thermosensitive layer comprises a polymer or compound with crosslinkable groups (such as hydroxyl groups, carboxyl groups, or amide groups), a crosslinking agent (such as melamine resin, urea resin, other amino resin, epoxy resin, or blocked isocyanate resin), a photoacid generator, and an infrared absorbing dye. A particularly suitable such thermosensitive layer comprises a polymer with hydroxyl groups (preferably an acetal resin with both acetal groups and hydroxyl groups), a melamine resin a photoacid generator, and an infrared absorbing dye.

Another particularly suitable such thermosensitive layer comprises a polymer with carboxyl groups, a melamine resin, a photoacid generator, and an infrared absorbing dye. A nonionic surfactant and/or a water-soluble polymer are preferably added. Other additives such as other surfactant, dye or pigment, and exposure indicating dye can also be added.

A preferred positive-working thermosensitive layer comprises a novalac resin, a diazo compound (preferably a benzoquinone diazide or naphthoquinone diazide compound), and an infrared absorbing dye. A photoacid generator is preferably added. A nonionic surfactant and/or a water-soluble polymer are also preferably added. Other additives such as other surfactant, dye or pigment, and exposure indicating dye can also be added.

A preferred visible light sensitive photosensitive layer comprises a polymeric binder (with or without ethylenic groups), a free radical polymerizable monomer having at least one terminal ethylenic group, a free-radical initiator, and a visible sensitizing dye. A nonionic surfactant is preferably added. Other additives such as surfactant, dye or pigment, exposure-indicating dye, and free-radical stabilizer may be added. The monomer preferably has at least 3 (meth)acrylate groups, more preferably at least 4 (meth)acrylate groups, even more preferably at least 5 (meth)acrylate groups, and most preferably at least 6 (meth)acrylate groups. The monomer can be a urethane (meth)acrylate monomer or a non-urethane (meth)acrylate monomer; preferably the monomer is a urethane (meth)acrylate monomer; more preferably both a non-urethane (meth)acrylate monomer and a urethane (meth)acrylate monomer are used in the photosensitive layer. One or more other monomers can also be added. The weight ratio of all the monomers to all the polymeric binders is preferably larger than 0.5, more preferably larger than 1.0, even more preferably larger than 1.5, and most preferably larger than 2.0.

A preferred negative-working violet or ultraviolet light sensitive photosensitive layer comprises a polymeric binder, a free radical polymerizable monomer having at least one terminal ethylenic group, a free-radical initiator, and a violet or ultraviolet sensitizing dye. A hydrogen donor is preferably added to increase the photospeed; a preferred hydrogen donor is a mercapto group-containing compound. A nonionic surfactant is preferably added to enhance on-press developability. Other additives such as surfactant, dye or pigment, exposure-indicating dye, and tee-radical stabilizer may be added. The monomer preferably has at least 3 (meth)acrylate groups, more preferably at least 4 (meth)acrylate groups, even more preferably at least 5 (meth)acrylate groups, and most preferably at least 6 (meth)acrylate groups. The monomer can be a urethane (meth)acrylate monomer or a non-urethane (meth) acrylate monomer; preferably the monomer is a urethane (meth)acrylate monomer; more preferably both a non-urethane (meth)acrylate monomer and a urethane (meth)acrylate monomer are used in the photosensitive layer. One or more other monomers can also be added. The weight ratio of all the monomers to all the polymeric binders is preferably larger than 0.5, more preferably larger than 1.0, even more preferably larger than 1.5, and most preferably larger than 2.0.

Another preferred negative-working violet or ultraviolet laser sensitive photosensitive layer comprises a polymeric binder, a monomer having at least 3 (meth)acrylate group, a hexaarylbiimidazole or titanocene compound, a dialkylaminobenzophenone compound, and a hydrogen donor. A hexaarylbiimidazole compound is preferred among hexaarylbiimidazole and titanocene compounds. A preferred dialkylaminobenzophenone compound is a 4,4'-bis(dialkylamino) benzophenone compound. A preferred hydrogen donor is a mercapto group-containing compound. The monomer is preferably a urethane (meth)acrylate monomer. More preferably, the monomer is a urethane (meth)acrylate monomer and the photosensitive layer further comprises a non-urethane (meth) acrylate monomer. Even more preferably, the photosensitive layer comprises a urethane monomer with at least 3 (meth) acrylate groups and a non-urethane monomer with at least 3 (meth)acrylate groups. Most preferably, the photosensitive layer comprises a urethane monomer with at least 4 (meth) acrylate groups and a non-urethane monomer with at least 4 (meth)acrylate groups. A nonionic surfactant is preferably added in the photosensitive layer. The weight ratio of all the monomers to all the polymeric binders is preferably larger man 0.5, more preferably larger than 1.0, even more preferably larger than 1.5, and most preferably larger than 2.0.

A third preferred negative-working violet or ultraviolet laser sensitive photosensitive layer comprises a polymeric binder, a urethane monomer having at least 4 (meth)acrylate groups, a hexaarylbiimidazole or titanocene compound, and a dialkylaminobenzophenone compound. A mercapto group-containing compound is preferably added. The weight ratio of all the monomers to all the polymeric binders is preferably at least 0.5, more preferably from 1.0 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound. A non-urethane (meth)acrylate monomer is preferably added.

A fourth preferred negative-working violet or ultraviolet laser sensitive photosensitive layer comprises a polymeric binder, a urethane monomer having at least 4 (meth)acrylate groups, a non-urethane monomer having at least 4 (meth) acrylate groups, a free radical initiator, and a violet or ultraviolet sensitizing dye. A mercapto group-containing compound is preferably added. The weight ratio of the urethane (meth)acrylate monomer to the non-urethane (meth)acrylate monomer is preferably from 0.10 to 10.0, more preferably from 0.20 to 5.0, and most preferably from 0.30 to 3.0. The weight ratio of all the monomers to all the polymeric binders is preferably at least 0.5, more preferably from 1.0 to 6.0, even more preferably from 1.5 to 5.0, and most preferably from 2.0 to 4.0. A preferred free radical initiator is a hexaarylbiimidazole or titanocene compound, more preferably a hexaarylbiimidazole compound. A preferred sensitizing dye is a dialkylaminobenzophenone compound, more preferably a 4,4'-bis (dialkylamino)benzophenone compound.

A fifth preferred negative-working violet or ultraviolet laser sensitive photosensitive layer comprises a polymeric binder having polymer backbone with recurring units having pendant poly(alkylene glycol) side chains, a (meth)acrylate monomer having at least one (meth)acrylate group, a free-radical initiator, and a violet or ultraviolet sensitizing dye. A mercapto group-containing compound is preferably added. Other additives such as surfactant, dye or pigment, exposure-indicating dye, and free-radical stabilizer may be added. The weight ratio of all the monomers to all the polymeric binders is preferably at least 1.0, more preferably from 1.5 to 6.0, and most preferably from 2.0 to 5.0.

A sixth preferred negative-working violet or ultraviolet laser sensitive photosensitive layer comprises a polymeric binder, a urethane monomer having at least 4 (meth)acrylate groups, a phosphate ester-containing (meth)acrylate monomer, a free radical initiator, and a violet or ultraviolet sensitizing dye. A mercapto group-containing compound is preferably added. The weight ratio of all the monomers to all the polymeric binders is preferably at least 0.5, more preferably from 1.0 to 6.0, and most preferably from 2.0 to 5.0. A preferred free radical initiator is a hexaarylbiimidazole or titanocene compound, more preferably a hexaarylbiimidazole compound. A preferred sensitizing dye is a dialkylaminobenzophenone compound, more preferably a 4,4'-bis(dialkylamino)benzophenone compound. A phosphate-free non-urethane (methacrylate monomer can be added.

A seventh preferred negative-working violet or ultraviolet laser sensitive photosensitive layer comprises a polymer or compound with crosslinkable groups (such as hydroxyl groups, carboxyl groups, or amide groups), a crosslinking agent (such as melamine resin, urea resin, other amino resin, epoxy resin, or blocked isocyanate resin), a photoacid generator, and a violet or ultraviolet sensitizing dye. A particularly suitable such photosensitive layer comprises a polymer with hydroxyl groups (preferably an acetal resin with both acetal groups and hydroxyl groups), a melamine resin, a photoacid generator, and a violet or ultraviolet dye. Another particularly suitable such photosensitive layer comprises a polymer with carboxyl groups, a melamine resin, a photoacid generator, and a violet or ultraviolet sensitizing dye. A nonionic surfactant and/or a water-soluble polymer are preferably added. Other additives such as other surfactant, dye or pigment, and exposure indicating dye can also be added.

A eighth preferred negative-working violet or ultraviolet laser sensitive photosensitive layer comprises an epoxy or vinyl ether monomer having at least one epoxy or vinyl ether group (preferably an epoxy monomer having at least 2 epoxy groups), a photoacid generator, and a violet or ultraviolet sensitizing dye. A polymeric binder is preferably added. Other additives such as surfactant, dye or pigment, exposure-indicating dye, and acid quencher (usually an alkaline compound, such as tetrabutylammonium hydroxide or triethylamine) may be added.

A preferred positive-working violet or ultraviolet laser sensitive photosensitive layer comprises a novalac resin, a diazo compound (preferably a benzoquinone diazide or naphthoquinone diazide compound), and a violet or ultraviolet laser sensitizing dye. A photoacid generator is preferably added. A nonionic surfactant and/or a water-soluble polymer are also preferably added. Other additives such as other surfactant, dye or pigment, and exposure indicating dye can also be added.

As for all the photosensitive layer of this invention, the above photosensitive layers (including thermosensitive layers) are soluble or dispersible in ink and/or fountain solution in the non-hardened (for negative-working) or solubilized (for positive-working) areas, so that they can be on-press developed with ink and/or fountain solution.

On-press developable lithographic plates and photosensitive layers as described in U.S. Pat. Nos. 6,482,571, 6,576,401, 6,548,222, 6,541,183, 6,551,757, 6,899,994, 6,949,327, 7,213,516 and 7,358,034, and U.S. patent application Ser. Nos. 11/057,663, 11/175,518, 11/266,817, 11/336,132, 11,356,911, 11/487,939, 11/604,603, 11/638,932, 11/645,376, 11/651,913, 11/787,878, 11/800,634, 11/810,710, 11/825,576, 11/72,648, 11/859,756, 11/873,349, 11/944,204, 12/022,133, 12/022,966 and 12/236,485, the entire disclosures of which are hereby incorporated by reference, can be used for the instant invention.

Infrared lasers useful for the imagewise exposure of the thermosensitive plates of this invention include laser sources emitting in the near infrared region, i.e. emitting in the wavelength range of from 750 to 1200 nm, and preferably from 800 to 1100 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably from 1 to 2000 $mJ/cm^2$, more preferably from 5 to 500 $mJ/cm^2$, and most preferably from 20 to 200 $mJ/cm^2$, depending on the sensitivity of the thermosensitive layer.

Visible lasers (including violet laser) useful for the imagewise exposure of the visible laser sensitive plates of this invention include any laser emitting in the wavelength range of from 390 to 600 nm. Examples of suitable visible lasers include frequency-doubled Nd/YAG laser (about 532 nm), argon ion laser (about 488 nm), violet diode laser (about 405 nm), and visible LEDs. Violet laser diode is especially useful because of its small size and relatively low cost. The exposure dosage is preferably from 1 to 2000 $\mu J/cm^2$ (0.001 to 2 $mJ/cm^2$), more preferably from 5 to 500 $\mu J/cm^2$, and most preferably from 20 to 200 $mJ/cm^2$, depending on the sensitivity of the photosensitive layer.

Violet or ultraviolet lasers useful for the imagewise exposure of the plates of this invention include any lasers having a wavelength of from 200 to 430 nm, such as violet laser diodes having a wavelength of from 390 to 430 nm, and ultraviolet laser diodes or LEDs having a wavelength of from 200 to 390 nm. Laser diodes are preferred violet or ultraviolet lasers. The exposure dosage is preferably from 1 to 2000 $\mu J/cm^2$ (0.001 to 2 $\mu J/cm^2$), more preferably from 5 to 500 $\mu J/cm^2$, and most preferably from 20 to 200 $\mu J/m^2$, depending on the sensitivity of the photosensitive layer. Violet laser with a wavelength of from 390 to 430 nm is particularly useful among violet and ultraviolet lasers.

Laser imaging devices are currently widely available commercially. Any device can be used which provides imagewise laser exposure according to digital imaging information. Commonly used imaging devices include flatbed imager, internal drum imager, and external drum imager, all of which can be used for the imagewise laser exposure in this invention.

The on-press developable plate can be exposed on an exposure device followed by heating, and then mounted on press to develop with ink and/or fountain solution followed by printing out regular printed sheets. Alternatively, the plate can be exposed on a printing press (such as by mounting on the plate cylinder or sliding rough a flatbed imager mounted on the press) followed by heating on the press, and then developed on the press with ink and/or fountain solution followed by printing out regular printed sheets. The ink and/or fountain solution solubilized or dispersed photosensitive layer can be mixed into the ink and/or the fountain solution on the rollers, and/or can be transferred to the blanket and then the receiving medium (such as paper). The fountain solution roller is engaged (to the plate cylinder as for conventional ing system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium (such as paper). Good quality prints should be obtained preferably under 40 initial impressions, more preferably under 20 impressions, and most preferably under 5 impressions (of printed sheets).

The ink and fountain solution may be applied at any combination or sequence, as needed for the plate; there is no particular limitation. For conventional wet press, usually fountain solution is applied (to contact the plate) first, followed by contacting with ink roller; preferably, fountain solution is applied to the plate first to dampen without removing the photosensitive layer, followed by contacting with ink to remove the non-hardened areas of the photosensitive layer. For press with integrated inking/dampening system, the ink and fountain solution are emulsified by various press rollers before being transferred to the plate as emulsion of ink and fountain solution.

The plate can be treated with a deactivating agent (preferably a deactivating solution and more preferably an aqueous deactivating solution) to deactivate the photo hardening (for negative-working plate) or photo solubilization (for positive-working plate) capability of the photosensitive layer at least in the non-exposed areas, after laser exposure and before on-press development. Preferably, the plate is treated with the deactivating agent after laser exposure followed by heating and before on-press development. More preferably, upon deactivation, the non-exposed areas of the photosensitive layer of the exposed and heated plate become incapable of hardening (for negative-working plate) or solubilization (for positive-working plate) under white room light, so that it can be handled and on-press developed freely under white room light. Various deactivating agents as described in U.S. patent application Ser. Nos. 11/266,817, 11/356,911 and 11/728,648, the entire disclosures of which are hereby incorporated by reference, can be used for the instant invention.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing Science and Technology" by Pappas, Plenum Press, New York, 1992.

The fountain solution used in this application can be any fountain solution used in lithographic printing. Fountain solution is used on wet lithographic printing presses to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of the plate substrate as well as the plate. Various fountain solution compositions are described in U.S. Pat. Nos. 4,030,417 and 4,764,213.

Emulsion of ink and fountain solution is an emulsion formed from ink and fountain solution during wet lithographic printing process. Because fountain solution (containing primarily water) and ink are not miscible, they do not form stable emulsion. However, emulsion of ink and fountain solution can form during shearing, compressing, and decompressing actions by the rollers and cylinders, especially the ink rollers and plate cylinder, on a wet lithographic press. For wet press with integrated inking system, ink and fountain solution are emulsified on the ink rollers before transferred to the plate.

The plate of this invention is on-press developed with ink and/or fountain solution. Preferably, the plate is a wet plate which is on-press developed with ink and/or fountain solution, or a waterless plate which is on-press developed with ink. More preferably, the plate is a wet plate which is on-press developed with ink and/or fountain solution. Most preferably, the plate is a wet plate with oleophilic photosensitive layer and hydrophilic substrate and is on-press developed with ink and fountain solution.

This invention is further illustrated by the following examples of its practice. Unless specified, all the values are by weight.

Examples 1-2

An electrochemically grained, anodized and polyvinyl phosphonic acid treated aluminum sheet was coated using a #8 Mayer rod with a thermosensitive layer formulation PS-1, followed by drying in an oven at 70° C. for 5 min.

PS-1

| Component | Weight ratios |
|---|---|
| Epon 1031 (Epoxy resin from Shell Chemical Company) | 2.326 |
| Cyracure UVR-6110 (Epoxy resin from Union Carbide) | 3.786 |
| Cyracure UVI-6974 (Cationic initiator from Union Carbide) | 0.852 |
| CD-1012 (Cationic initiator from Sartomer Company) | 0.252 |
| Neocryl B-728 (Polymeric binder from Zeneca) | 2.520 |
| IR-140 (Infrared dye from Eastman Kodak) | 0.654 |
| FC-120 (Surfactant from 3M) | 0.036 |
| Ethyl acetate | 78.825 |
| Acetone | 10.749 |

The above plate was exposed with an infrared laser imager equipped with laser diodes emitting at 830 nm (ThermalSetter™ from Optronics International). The plate was mounted on the imaging drum and secured with vacuum and masking tape, and exposed at a laser dosage of about 250 $mJ/cm^2$. The exposed plate was cut into 2 pieces for hardier tests.

The first piece of the exposed plate was heated to 100° C. for 4 minutes in an oven, and then subjected to hand test for on-press developability and curing. The plate was rubbed back and forth for 20 times with a cloth soaked with both fountain solution and ink. The plate showed clean background in the non-exposed areas and inked images in the exposed areas, indicating hardening of the photosensitive layer in the exposed areas.

The second piece of the exposed plate was directly tested with fountain solution and ink. The exposed plate without any heating was rubbed back and forth for 20 times with a cloth soaked with both fountain solution and ink. The plate showed clean background in both the non-exposed and the exposed areas, and no inked images were formed in the exposed areas, indicating non-hardening of the photosensitive layer in the exposed areas.

Examples 3-4

An electrochemically gained, anodized and sodium silicate treated aluminum sheet was first coated with a 0.11% aqueous solution of polyvinyl alcohol (Airvol 540 from Air Products) with a #6 Mayer rod, followed by drying in an oven at 80° C. for 5 min. The polyvinyl alcohol coated substrate was further coated with a thermosensitive layer formulation PS-2 with a #6 Mayer rod, followed by drying in an oven at 80° C. for 5 min.

| PS-2 | |
|---|---|
| Component | Weight ratios |
| Neocryl B-728 (Polymeric binder from Zeneca) | 0.273 |
| Sartomer SR-399 (Acrylic monomer from Sartomer) | 0.653 |
| Pluronic L43 (Nonionic surfactant from BASF) | 0.056 |
| (4-(2-Hydroxytetradecyl-oxy)-phenyl)phenyliodonium hexafluoroantimonate | 0.100 |
| PINA FK-1026 (Infrared absorbing polymethine dye from Allied Signal) | 0.050 |
| Acetone | 9.018 |

The above plate was exposed with an infrared laser plate imager equipped with laser diodes emitting at about 830 nm (Pearlseter™ from Presstek). The plate was mounted on the imaging drum (external drum) and exposed at a laser dosage of about 450 mJ/cm$^2$. The exposed plate was cut into 2 pieces for further tests.

The first piece of the exposed plate was heated to 120° C. for 2 minutes in an oven before mounted on press for on-press development and printing tests. The second piece of the exposed plate was directly tested on press without any heating.

Each of the above plate pieces was tested on a wet lithographic press (AB Dick 360) equipped with integrated inking/dampening system. The plate was mounted on the plate cylinder of the press. After the press was started for 10 rotations, the ink roller (carrying emulsion of ink and fountain solution) was contacted with the plate cylinder for 20 rotations. The plate cylinder was then engaged with the blanket cylinder and printed with paper for 200 impressions. Both plate pieces showed clean background in the non-exposed areas. The first plate piece showed good inking in the exposed areas (indicating good curing), while the second plate piece showed fair inking in the exposed areas (indicating insufficient curing).

I claim:

1. A method of lithographically printing images on a receiving medium, comprising in order:

(a) providing a lithographic printing plate comprising on a substrate a photosensitive layer, wherein said photosensitive layer comprises a polymer or compound capable of crosslinking with a crosslinking agent, a crosslinking agent capable of crosslinking with said polymer or compound in the presence of a Bronsted acid at elevated temperature, a photoacid generator and a sensitizing dye and is capable of hardening upon exposure to a laser having a wavelength selected from 200 to 1200 nm followed by heating, the non-hardened areas of said photosensitive layer are soluble or dispersible in ink and/or fountain solution, and said plate is free of any overcoat on said photosensitive layer;

(b) activating the photosensitive layer by imagewise exposing said plate with said laser without hardening in the exposed areas so that such activated areas can be hardened upon heating;

(c) hardening the exposed areas of the photosensitive layer by overall heating said plate to an elevated temperature, without causing hardening of the non-exposed areas;

(d) developing said plate with ink and/or fountain solution on a lithographic press to remove the non-hardened areas of said photosensitive layer; and (e) lithographically printing images from said plate to the receiving medium.

2. The method of claim 1 wherein said plate is heated to 50 to 200° C. for 1 to 240 seconds in said step (c).

3. The method of claim 1 wherein said plate is heated to 80 to 140° C. for 1 to 30 seconds in said step (c).

4. The method of claim 1 wherein said plate is heated by passing through a heating device off press.

5. The method of claim 1 wherein said plate is heated while mounted on said lithographic press.

6. The method of claim 1 wherein said plate is heated by passing through a heating device in a white light room, and said heating device is shielded with covers that are non-transparent or only transparent to yellow-red light so that said plate on said device is in substantial darkness or under yellow-red light.

7. The method of claim 1 wherein said plate is heated while mounted on said lithographic press before said on-press development, and during said heating said press is shielded with covers that are non-transparent or only transparent to yellow-red light so that said plate on said press is in substantial darkness or under yellow-red light.

8. The method of claim 1 wherein said photosensitive layer is negative-working and is hardened through chemical reaction.

9. The method of claim 1 wherein said photosensitive layer comprises a free radical polymerizable monomer, a free radical initiator, and a sensitizing dye.

10. The method of claim 1 wherein said photosensitive layer comprises a compound having at least 2 epoxide groups, a cationic initiator, and a sensitizing dye.

11. The method of claim 1 wherein said laser is a violet or ultraviolet laser having a wavelength selected from 200 to 430 nm.

12. The method of claim 1 wherein said laser is an infrared laser having a wavelength selected from 750 to 1200 nm.

* * * * *